United States Patent
Oh et al.

(10) Patent No.: US 9,436,545 B2
(45) Date of Patent: Sep. 6, 2016

(54) SEMICONDUCOTR MEMORY DEVICE INCLUDING NON-VOLATILE MEMORY CELL ARRAY

(71) Applicant: Samsung Electronics Co., Ltd., Suwon-si (KR)

(72) Inventors: Chi-Sung Oh, Suwon-si (KR); Chul-Sung Park, Seoul (KR); Sang-Bo Lee, Yongin-si (KR); Dong-Hyun Sohn, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 240 days.

(21) Appl. No.: 14/165,820

(22) Filed: Jan. 28, 2014

(65) Prior Publication Data
US 2014/0223257 A1    Aug. 7, 2014

(30) Foreign Application Priority Data
Feb. 4, 2013    (KR) .................. 10-2013-0012407

(51) Int. Cl.
*G11C 29/00* (2006.01)
*G06F 11/10* (2006.01)
*G06F 11/16* (2006.01)
*G11C 11/00* (2006.01)
*G11C 29/42* (2006.01)
*G11C 29/44* (2006.01)
*G11C 11/4076* (2006.01)
*G11C 11/40* (2006.01)
*G11C 29/04* (2006.01)
*G11C 29/12* (2006.01)

(52) U.S. Cl.
CPC ........... *G06F 11/1048* (2013.01); *G06F 11/16* (2013.01); *G11C 11/005* (2013.01); *G11C 11/4076* (2013.01); *G11C 29/42* (2013.01); *G11C 29/4401* (2013.01); *G11C 29/785* (2013.01); *G11C 11/40* (2013.01); *G11C 2029/0409* (2013.01); *G11C 2029/0411* (2013.01); *G11C 2029/1202* (2013.01); *G11C 2029/1204* (2013.01)

(58) Field of Classification Search
CPC ........... G06F 11/1048; G06F 11/1068; G06F 22/2048; G06F 22/2068; G06F 11/1072; G06F 11/16; G11C 29/42; G11C 29/44; G11C 29/783; G11C 29/785
See application file for complete search history.

(56) References Cited

U.S. PATENT DOCUMENTS

| | | | |
|---|---|---|---|
| 6,438,065 B1 | 8/2002 | Rao et al. | |
| 7,872,936 B2 * | 1/2011 | Blankenship | ....... G06F 13/4243 365/189.04 |
| 7,966,546 B2 | 6/2011 | Mokhlesi et al. | |
| 8,345,501 B2 | 1/2013 | Jeong | |
| 8,402,217 B2 * | 3/2013 | Burd | .................. G06F 11/1028 365/185.33 |

(Continued)

*Primary Examiner* — Shelly A Chase
(74) *Attorney, Agent, or Firm* — Muir Patent Law, PLLC (57) ABSTRACT

A semiconductor memory device that may correct error data using an error correction circuit is disclosed. The semiconductor memory device may include a DRAM cell array, a parity generator, a nonvolatile memory cell array and an error correction circuit. The parity generator is configured to generate a first set of parity bits having at least one bit based on input data. The nonvolatile memory cell array may store the input data and the first set of parity bits corresponding to the input data, and to output first data corresponding to the input data, and a second set of parity bits corresponding to the first set of parity bits. The error correction circuit is configured to generate second data as corrected data based on the first data.

20 Claims, 7 Drawing Sheets

(56) References Cited

U.S. PATENT DOCUMENTS

| | | | | |
|---|---|---|---|---|
| 8,423,837 B2* | 4/2013 | Madan | ................ | G06F 11/1048 714/54 |
| 8,769,378 B2* | 7/2014 | Yoo | .................... | G06F 11/1068 714/764 |
| 8,812,898 B1* | 8/2014 | Lahon | .................... | G06F 13/00 714/4.2 |
| 9,037,941 B2* | 5/2015 | Dong | .................. | G06F 11/1012 714/755 |
| 2010/0257428 A1 | 10/2010 | Murin | | |
| 2011/0029841 A1 | 2/2011 | Rho | | |
| 2011/0154158 A1 | 6/2011 | Yurzola et al. | | |

\* cited by examiner

| No. of CODE WORD BITS(n + m) | No. of DATA BITS(n = $2^{m-1}$) | No. of PARITY BITS(m) | ARRAY AREA OVERHEAD[%] |
|---|---|---|---|
| 7 | 4 | 3 | 75.0 |
| 12 | 8 | 4 | 50.0 |
| 21 | 16 | 5 | 31.3 |
| 38 | 32 | 6 | 18.8 |
| 71 | 64 | 7 | 10.9 |
| 136 | 128 | 8 | 6.3 |
| 265 | 256 | 9 | 3.5 |

SEMICONDUCOTR MEMORY DEVICE INCLUDING NON-VOLATILE MEMORY CELL ARRAY

CROSS-REFERENCE TO RELATED APPLICATION

This application claims priority under 35 U.S.C. §119 to Korean Patent Application No. 10-2013-0012407 filed on Feb. 4, 2013, the entire contents of which are incorporated herein by reference in their entirety.

BACKGROUND

Embodiments of the disclosure relate to a semiconductor memory device, and particularly, to a semiconductor memory device including a non-volatile memory cell array that corrects errors using an error correction circuit.

Recently, a semiconductor memory device including a non-volatile memory cell array in a dynamic random access memory (DRAM) device has been studied. The non-volatile memory cell array may include an anti-fuse cell array that is used to activate a redundancy cell array when defective cells are included in a memory cell array. However, it is desirable to reduce an area of the anti-fuse cell array to improve a productivity of the semiconductor memory device.

SUMMARY

Embodiments of the disclosure provide a semiconductor memory device including a non-volatile memory cell array that occupies small area of a semiconductor chip.

The technical objectives of the inventive concept are not limited to the above disclosure; other objectives may become apparent to those of ordinary skill in the art based on the following descriptions.

In accordance with an exemplary embodiment, a semiconductor memory device includes a dynamic random access memory (DRAM) cell array, a parity bit generator, a nonvolatile memory cell array and an error correction circuit.

The parity bit generator is configured to generate a first set of parity bits having at least one bit based on input data received from outside the semiconductor memory device. The nonvolatile memory cell array is configured to store the input data and the first set of parity bits corresponding to the input data, and to output first data corresponding to the input data and a second set of parity bits corresponding to the first set of parity bits. The error correction circuit is configured to generate second data as corrected data based on the first data and the second set of parity bits. The semiconductor memory device is configured to use the second data to select a spare cell of the DRAM cell array.

In an embodiment, the semiconductor memory device is configured to use the second data as corrected data if the first data is different from the input data.

In another embodiment, the semiconductor memory device is configured to use the second data to replace a defective word line of the DRAM cell array with a spare word line.

In still another embodiment, the semiconductor memory device is configured to use the second data to replace a defective column selecting line of the DRAM cell array with a spare column selecting line.

In yet another embodiment, the DRAM cell array may include a normal memory cell array connected to word lines and column selecting lines, and a spare memory cell array connected to spare word lines and spare column selecting lines.

In yet another embodiment, the semiconductor memory device may further include a column decoder and a spare column decoder.

The column decoder is configured to generate column selection signals and to provide the column selection signals to the column selecting lines. The spare column decoder is configured to generate spare column selection signals based on the second data, and to provide the spare column selection signals to the spare column selecting lines when a defective cell is included in the normal memory cell array.

In yet another embodiment, the second data may be anti-fuse program data.

In yet another embodiment, the semiconductor memory device may be a stacked memory device in which a plurality of chips communicating data and control signals through a through-silicon-via (TSV) are stacked.

In yet another embodiment, the nonvolatile memory cell array may include an anti-fuse cell array having a plurality of anti-fuse cells.

In yet another embodiment, a number of bits of the first set of parity bits is smaller than a number of bits of the input data.

In accordance with another exemplary embodiment, a semiconductor memory device includes a DRAM cell array, a nonvolatile memory cell array and an error correction circuit.

The nonvolatile memory cell array is configured to store input data and a first set of parity bits having at least one bit, the input data and the first set of parity bits received from outside the semiconductor memory device. The error correction circuit is configured to generate second data as corrected data based on first data corresponding to the input data, the first data being received from the nonvolatile memory cell array, and a second set of parity bits corresponding to the first set of parity bits, the second set of parity bits being received from the nonvolatile memory cell array. The semiconductor memory device is configured to use the second data to repair a defective cell included in the DRAM cell array.

In an embodiment, the semiconductor memory device may be suitable for repairing defective bits in a semiconductor wafer level before packaging.

According to embodiments of the disclosure, a semiconductor memory device including a non-volatile memory cell array may correct error bits using an error correction circuit. Therefore, the semiconductor memory device may have a small chip size.

In accordance with an exemplary embodiment, a semiconductor memory device includes a memory cell array, a parity bit generator, an anti-fuse cell array and an error correction circuit.

The parity bit generator is configured to generate a first set of parity bits having at least one bit based on first data received from outside the semiconductor memory device. The anti-fuse cell array includes a plurality of anti-fuse cells configured to store the first data and the first set of parity bits, and to transfer second data corresponding to the first data, and a second set of parity bits corresponding to the first set of parity bits. The error correction circuit is configured to generate third data as corrected data based on the second data and the second set of parity bits. The semiconductor memory device is configured to use the third data to select a spare cell of the memory cell array.

BRIEF DESCRIPTION OF THE DRAWINGS

Illustrative, non-limiting example embodiments will be more clearly understood from the following detailed description taken in conjunction with the accompanying drawings. In the drawings.

DETAILED DESCRIPTION OF THE EMBODIMENTS

Example embodiments of the present disclosure will be described more fully with reference to the accompanying drawings, in which some example embodiments are shown. The present disclosure may, however, be embodied in many different forms and should not be construed as limited to the embodiments set forth herein. Like reference numerals refer to like elements throughout the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the disclosure, such elements should not be construed as limited by these terms. Unless indicated otherwise, these terms are used to distinguish one element from another. For example, a first element could be termed a second element, and a second element could be termed a first element, without departing from the scope of the present disclosure. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present disclosure should not preclude the presence of more than one referent. In other words, elements of the disclosure referred to in the singular may number one or more, unless the context clearly indicates otherwise. It will be further understood that the terms such as "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

Figure 1:
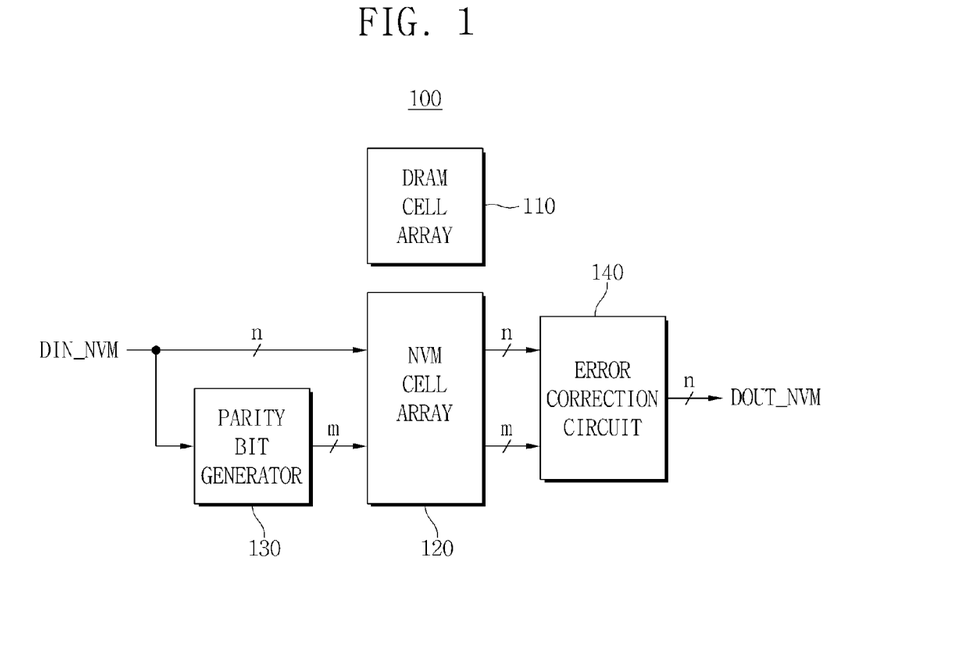
FIG. 1 is an exemplary block diagram illustrating a semiconductor memory device including a non-volatile memory cell array, in accordance with an embodiment.

FIG. 1 is an exemplary block diagram illustrating a semiconductor memory device 100 including a non-volatile memory cell array, in accordance with an embodiment.

Referring to FIG. 1, the semiconductor memory device 100 may include a DRAM cell array 110, a parity bit generator 130, a nonvolatile memory cell array 120 and an error correction circuit 140.

The parity bit generator 130 may generate a first set of parity bits having at least one bit based on input data DIN_NVM. The nonvolatile memory cell array 120 may store the input data DIN_NVM and the first set of parity bits, and output first data corresponding to the input data DIN_NVM and a second set of parity bits corresponding to the first set of parity bits. The error correction circuit 140 generates error data based on the first data and the second set of parity bits received from the nonvolatile memory cell array 120, respectively, to correct the first data based on the error data, and generate second data DOUT_NVM.

The second data DOUT_NVM may be used to repair a defective cell included in the DRAM cell array 110. The second data DOUT_NVM may be used to replace a defective word line of the DRAM cell array with a spare word line. The second data DOUT_NVM may be used to replace a defective column selecting line of the DRAM cell array with a spare column selecting line.

According to an embodiment, the DRAM cell array 110 may include a normal memory cell array connected to word lines and column selecting lines, and a spare memory cell array connected to spare word lines and spare column selecting lines.

According to an embodiment, the semiconductor memory device 100 may further include a column decoder and a spare column decoder. The column decoder may decode column address signals to generate column selection signals, and provide the column selection signals to the column selecting lines. The spare column decoder may generate spare column selection signals based on the second data, and provide the spare column selection signals to the spare column selecting lines when a defect is generated in at least one column selecting line of the column selecting lines.

The second data DOUT_NVM may be anti-fuse program data. The nonvolatile memory cell array 120 may include an anti-fuse cell array. The semiconductor memory device 100 may be suitable for repairing defective bits in a system level.

Figure 2:
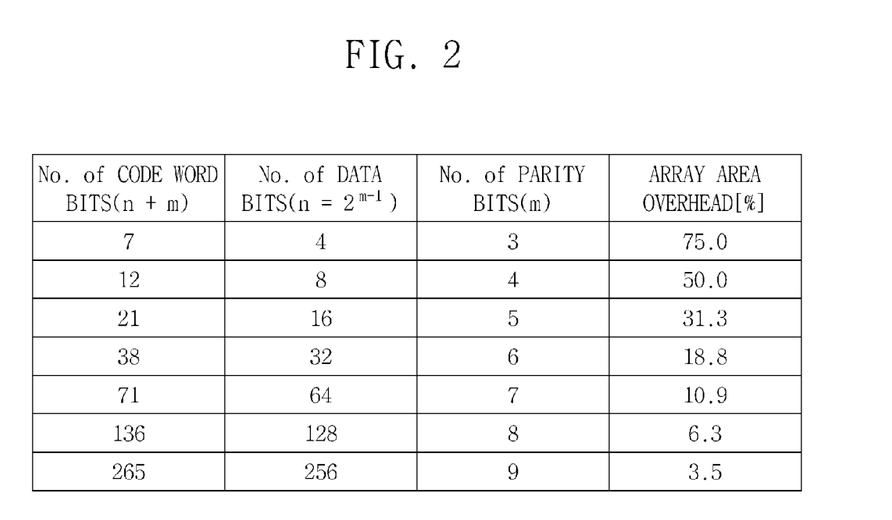
FIG. 2 is an exemplary table illustrating an array area increase according to parity bits when error correction is performed using Hamming codes, in accordance with an embodiment.

FIG. 2 is an exemplary table illustrating an array area increase according to parity bits when error correction is performed using Hamming codes, in accordance with an embodiment.

Referring to FIG. 2, it shows that an array area overhead, that is, an area occupied by an error correction circuit in a semiconductor wafer, is reduced according as the number of data bits and parity bits increase. For example, when the number of data bits is 16 and the number of parity bits is 5, it shows that a code word may have 21 bits and the array area overhead 31.3%.

Figure 3:
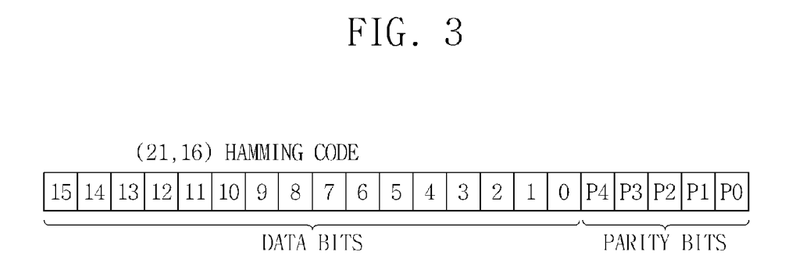
FIG. 3 is a diagram illustrating an example of the Hamming codes used in FIG. 2.

FIG. 3 is a diagram illustrating an example of the Hamming codes used in FIG. 2. In FIG. 3, Hamming codes are shown when the number of data bits is 16, and the number of parity bits is 5. The data bits have 16 bits from 0 to 15, the parity bits have 5 bits from P0 to P4, and the code word has 21 bits.

Since the semiconductor memory device according to disclosed embodiments correct errors of data stored in the non-volatile memory cell using the error correction circuit 140, the semiconductor memory device according to disclosed embodiments may occupy a semiconductor chip area smaller than the conventional semiconductor memory device.

In the conventional art, a semiconductor memory device may include a main cell and a voting cell having the same structure as the main cell to reduce error of data stored in the non-volatile memory cell. In this case, the semiconductor memory device may occupy double the area compared to a non-volatile memory cell including only a main cell.

Figure 4:
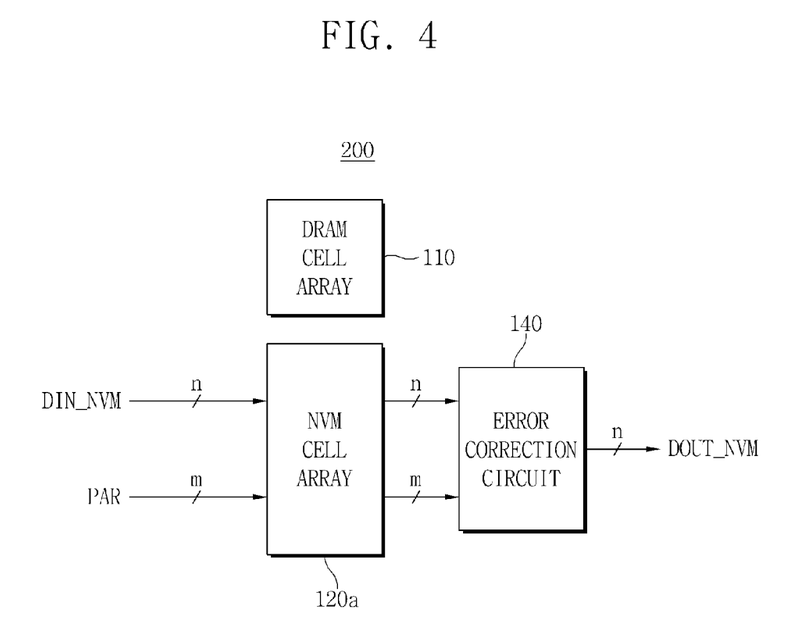
FIG. 4 is an exemplary block diagram illustrating a semiconductor memory device including a non-volatile memory cell array, in accordance with another embodiment.

FIG. 4 is an exemplary block diagram illustrating a semiconductor memory device 200 including a non-volatile memory cell array, in accordance with another embodiment.

Referring to FIG. 4, the semiconductor memory device 200 may include a DRAM cell array 110, a nonvolatile memory cell array 120a, and an error correction circuit 140.

The nonvolatile memory cell array 120a may store the input data DIN_NVM and a first set of parity bits PAR having at least one bit received from the exterior. The input data DIN_NVM and the first set of parity bits PAR are provided from outside the semiconductor memory device 200. The nonvolatile memory cell array 120a may store the input data DIN_NVM and the first set of parity bits PAR, and output first data corresponding to the input data DIN_NVM and a second set of parity bits corresponding to the first set of parity bits PAR. The error correction circuit 140 may generate error data based on the first data and the second set of parity bits, to correct the first data based on the error data, and generate second data DOUT_NVM.

In the semiconductor memory device 200 of FIG. 4, parity bits related to the input data DIN_NVM may be input from outside the semiconductor memory device 200. Therefore, in this example, the semiconductor memory device 200 does not include a parity generator, unlike the semiconductor memory device 100 of FIG. 1.

An operation of the semiconductor memory device 200 of FIG. 4 may be similar to that of the semiconductor memory device 100 of FIG. 1. The semiconductor memory device 200 of FIG. 4 may be suitable for repairing defective bits in a semiconductor wafer level before packaging.

Figure 5:
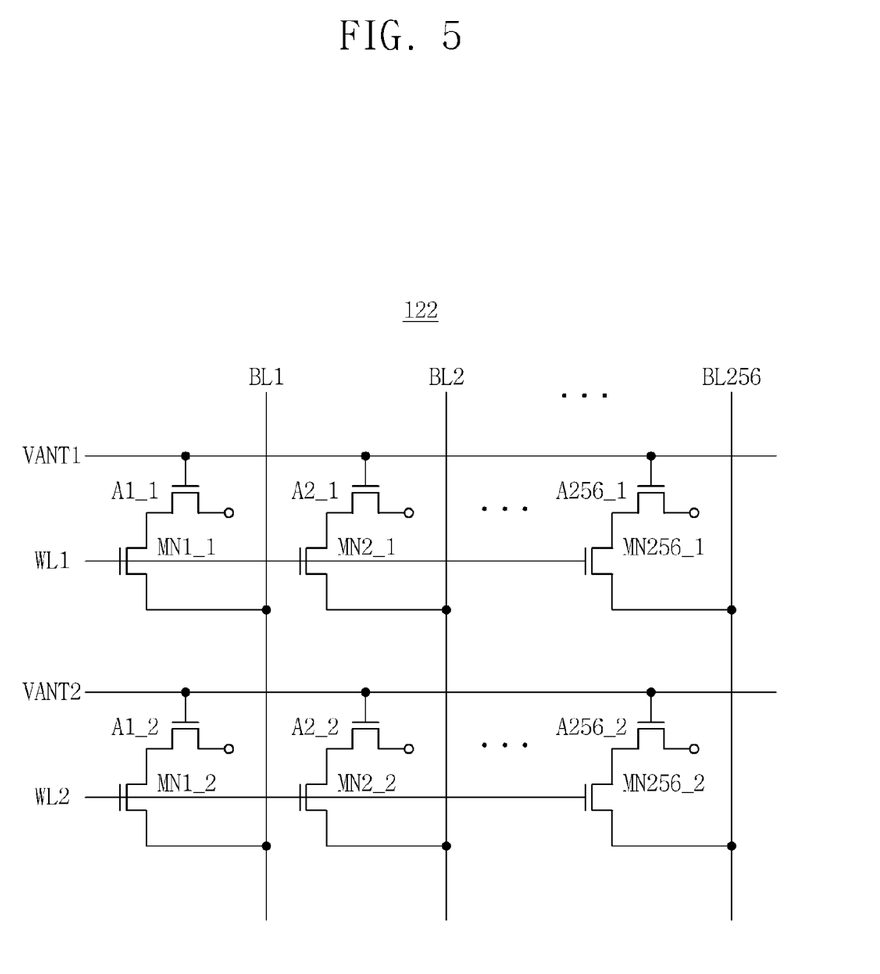
FIG. 5 is a circuit diagram illustrating the non-volatile memory cell array in FIG. 1, in accordance with an embodiment.

FIG. 5 is a circuit diagram illustrating the non-volatile memory cell array in FIG. 1 and FIG. 4, in accordance with an embodiment. In FIG. 5, an anti-fuse cell array is shown as an example of non-volatile memory cell array.

Referring to FIG. 5, an anti-fuse cell array 122 may include anti-fuse cells A1_1 to A256_1 and selection transistors MN1_1 to MN256_1 connected in series to the anti-fuse cells A1_1 to A256_1. Also, the anti-fuse cell array 122 may include anti-fuse cells A1_2 to A256_2 and selection transistors MN1_2 to MN256_2 connected in series to the anti-fuse cells A1_2 to A256_2.

In one embodiment, an anti-fusing voltage VANT1 may be applied to gates of the respective anti-fuse cells A1_1 to A256_1, and sources of the respective anti-fuse cells A1_1 to A256_1 may be floated. The selection transistors MN1_1 to MN256_1 may have drains, which are electrically connected to drains of the anti-fuse cells A1_1 to A256_1, respectively, and gates to which a word line drive signal WL1 is applied. Sources of the selection transistors MN1_1 to MN256_1 may be electrically connected to bit lines BL1 to BL256, respectively.

An anti-fuse voltage VANT2 may be applied to gates of the respective anti-fuse cells A1_2 to A256_2, and sources of the respective anti-fuse cells A1_2 to A256_2 may be floated. The selection transistors MN1_2 to MN256_2 may have drains, which are electrically connected to drains of the anti-fuse cells A1_2 to A256_2, respectively, and gates to which a word line drive signal WL2 is applied. Sources of the selection transistors MN1_2 to MN256_2 may be electrically connected to the bit lines BL1 to BL256, respectively.

Hereinafter, an exemplary operation of the anti-fuse cell array 122 of FIG. 5 will be described.

When the anti-fuse cell A1_1 is programmed, a high voltage of, for example, about 6 V may be applied as an anti-fusing voltage VANT1 to the gates of the anti-fuse cells A1_1 to A256_1. A voltage VANT1/2 of, for example, about 3 V may be applied to the gate of the selection transistor MN1_1 connected to the drain of the anti-fuse cell A1_1 to turn on the selection transistor MN1_1. A low electric potential of, for example, about 0 V may be applied to the bit line BL1 electrically connected to the source of the selection transistor MN1_1. Under this condition, a thin gate oxide layer of the anti-fuse cell A1_1 may be broken to form an ohmic contact between a gate electrode and the drain. Thus, a current path may be formed from a gate electrode of the anti-fuse cell A1_1 to the bit line BL1. In this case, a voltage VANT1/2 of, for example, about 3 V may be applied to bit lines (e.g., BL2 to BL256) electrically connected to unselected cells so that a high voltage is not applied to both ends of the gate oxide layer of the respective anti-fuse cells A2_1 to A256_1. Also, a low voltage of, for example, about 0 V may be applied to gates of the anti-fuse cells A1_2 to A256_2 to be unprogrammed and gates of the selection transistors MN1_2 to MN256_2 so that unselected anti-fuse cells may not be programmed.

Figure 6:
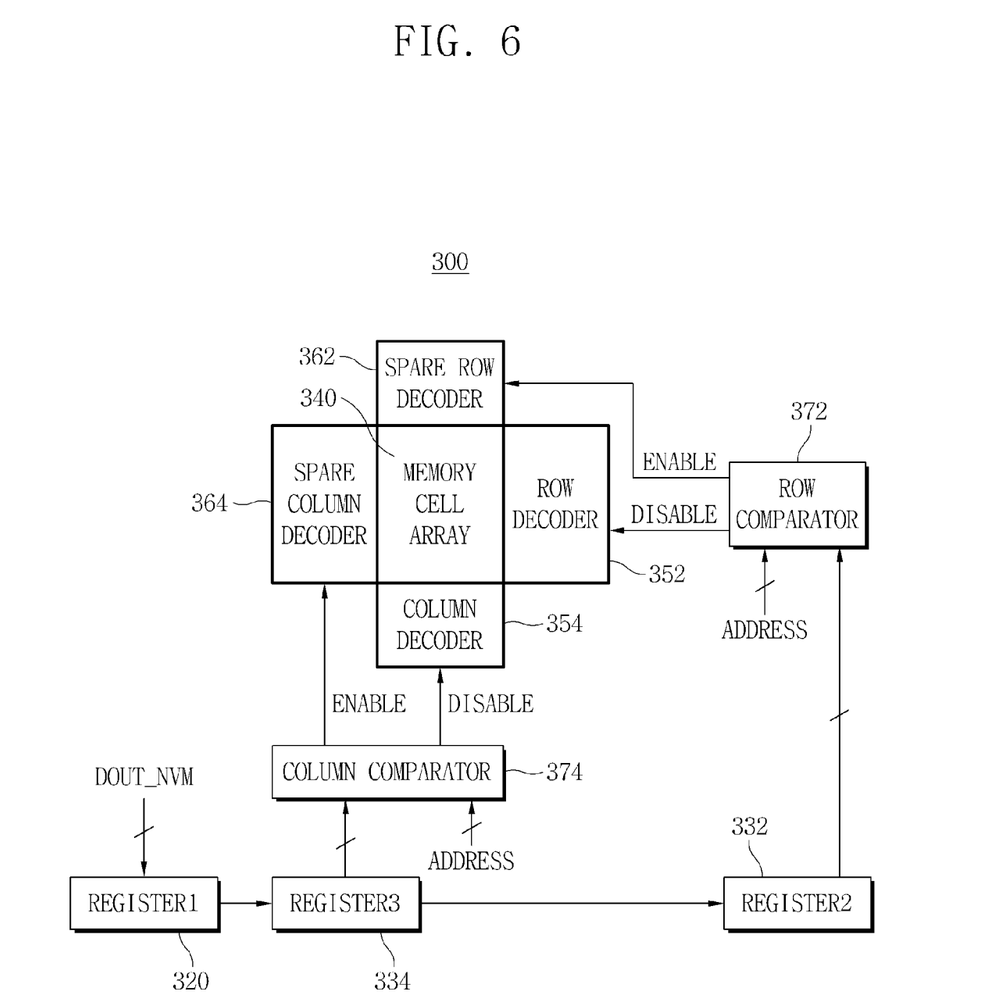
FIG. 6 is a block diagram illustrating a semiconductor memory device including a non-volatile memory cell array, in accordance with still another embodiment.

FIG. 6 is a block diagram illustrating a semiconductor memory device 300 including a non-volatile memory cell array, in accordance with still another embodiment. In FIG. 6, an embodiment of a method of repairing a defective cell included in the DRAM cell array using the second data DOUT_NVM in which error is corrected is illustrated. The second data DOUT_NVM may be output from the error correction circuit of the semiconductor memory device 100 of FIG. 1. Also, the second data DOUT_NVM may be output from the error correction circuit of the semiconductor memory device 200 of FIG. 4. The second data DOUT_NVM may be anti-fuse program data.

Referring to FIG. 6, the semiconductor memory device 300 may include a first register 320 that stores the second data DOUT_NVM, and second and third registers 332 and 334 that store the anti-fuse program data received from the first register 320. Further, the semiconductor memory device 300 may include a memory cell array 340 that stores data, a row decoder and a column decoder 352 and 354 that drive word lines and bit lines of the memory cell array 340, a spare row decoder and a spare column decoder 362 and 364 that drive spare cells, and a row comparator and a column comparator 372 and 374 that compare address information of a defective cell and external address information.

The first register 320 stores the anti-fuse program data (the second data DOUT_NVM), and then transfers the anti-fuse program data to the second and the third registers 332 and 334. Operation conditions of a semiconductor memory device 300 may be set using the anti-fuse program data stored in the second and the third registers 332 and 334.

The second and the third registers 332 and 334 may sequentially receive and store one-by-one bit of the anti-fuse program data from the first register 320. The second and the third registers 332 and 334 may be arranged adjacent to various circuit blocks requiring the anti-fuse program data. For example, the second register 332 that stores the row address information of a defective cell may be arranged adjacent to the row comparator 372. Further, the third register 334 that stores the column address information of a defective cell may be arranged adjacent to the column comparator 374.

The row comparator 372 compares the row address received from the exterior with the row address information of a defective cell, and drives the row decoder 352 or the spare row decoder 362 according to the comparison result. Similarly, the column comparator 374 compares the column address received from the exterior with the column address information of a defective cell, and drives the column decoder 354 or the spare column decoder 364 according to the comparison result.

The row comparator 372 and the column comparator 374 may include a plurality of logic devices to compare the address information received from the exterior and the address information of the defective cell, respectively.

Figure 7:
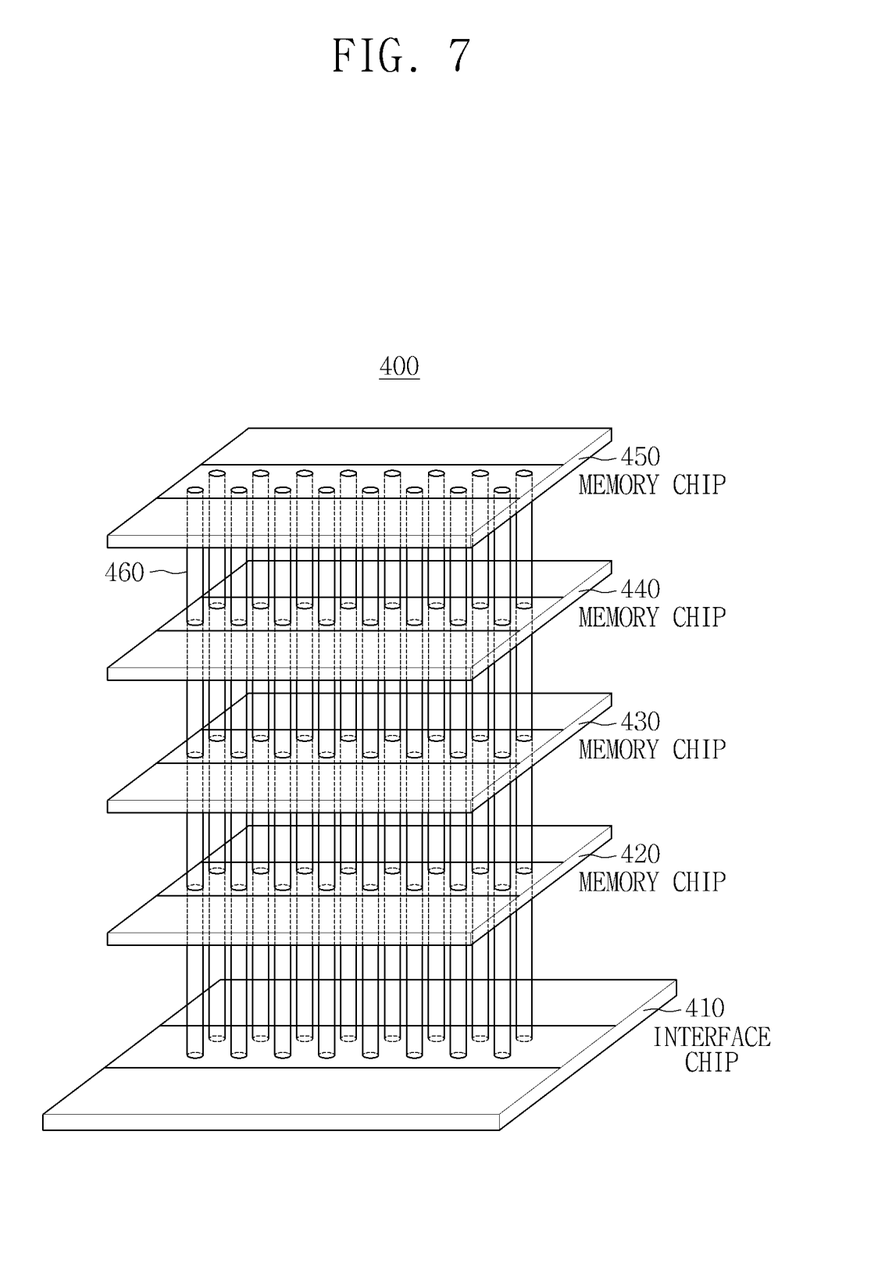
FIG. 7 is a perspective view of an example of a stacked semiconductor device including one or more semiconductor memory devices in accordance with certain embodiments.

FIG. 7 is a perspective view of an example of a stacked semiconductor device 400 including one or more semiconductor memory devices in accordance with certain embodiments.

Referring to FIG. 7, the stacked semiconductor device 400 may include an interface chip 410, and memory chips 420, 430, 440 and 450 which are electrically connected through through-substrate vias (e.g., through-silicon vias) 460. Although the through-substrate vias 460 disposed in two rows are shown in FIG. 7, the stack semiconductor device 400 may include any number of through-substrate vias.

The memory chips 420, 430, 440 and 450 included in the stacked semiconductor device 400 may correct error data of a non-volatile memory cell array using the error correction circuit according to the disclosed embodiments. The interface chip 410 may perform as an interface between the memory chips 420, 430, 440 and 450 and an external device.

Figure 8:
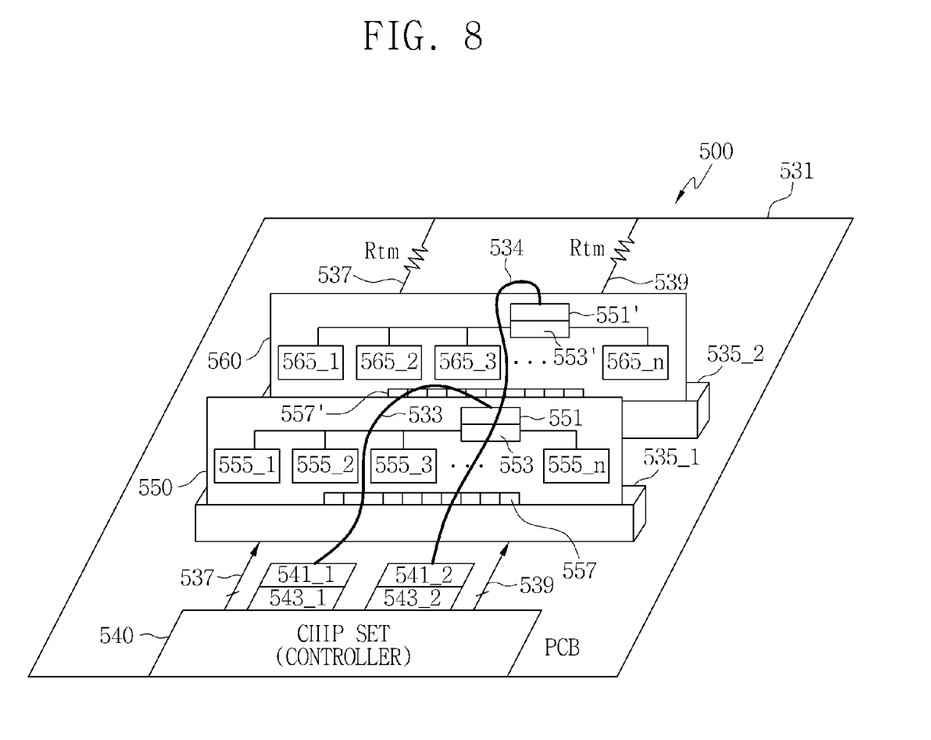
FIG. 8 is a diagram of an example of a memory system including a semiconductor memory device in accordance with certain embodiments.

FIG. 8 is a diagram of an example of a memory system 500 including a semiconductor memory device in accordance with certain embodiments.

Referring to FIG. 8, the memory system 500 may include a motherboard 531, a chip set (or a controller) 540, slots 535_1 and 535_2, memory modules 550 and 560, and transmission lines 533 and 534. Buses 537 and 539 may connect the chip set 540 with the slots 535_1 and 535_2. A terminal resistor Rtm may terminate each of the buses 537 and 539 on a PCB of the motherboard 531.

For convenience, in FIG. 8, only two slots 535_1 and 535_2 and two memory modules 550 and 560 are shown. However, the memory system 500 may include an arbitrary number of slots and memory modules.

The chip set 540 may be mounted on the PCB of the motherboard 531, and control an operation of the memory system 500. The chip set 540 may include connectors 541_1 and 541_2 and converters 543_1 and 543_2.

The converter 543_1 may receive parallel data generated by the chip set 540, convert the parallel data to serial data, and output the serial data to the transmission line 533 via the connector 541_1. The converter 543_1 may receive serial data from the memory module 550 via the transmission line 533, convert the serial data to parallel data, and output the parallel data to the chip set 540.

The converter 543_2 may receive parallel data generated by the chip set 540, convert the parallel data to serial data, and output the serial data to the transmission line 534 via the connector 541_2. The converter 543_2 may receive serial data from the memory module 560 via the transmission line 534, convert the serial data to parallel data, and output the parallel data to the chip set 540. The transmission lines 533 and 534 included in the memory system 500 may be a plurality of optical fibers.

The memory module 550 may include a plurality of memory devices 555_1 to 555_n, a first connector 557, a second connector 551, and a converter 553. The memory module 560 may include a plurality of memory devices 565_1 to 565_n, a first connector 557', a second connector 551', and a converter 553'.

The first connector 557 may transfer low-speed signals received from the chip set 540 to the memory devices 555_1 to 555_n, and the second connector 551 may be connected to the transmission line 533 for transferring high-speed signals.

The converter 553 may receive serial data via the second connector 551, convert the serial data to parallel data, and output the parallel data to the memory devices 555_1 to 555_n. Further, the converter 553 may receive parallel data from the memory devices 555_1 to 555_n, convert the parallel data to serial data, and output the serial data to the second connector 551.

Each of the memory devices 555_1 to 555_n and 565_1 to 565_n may include a semiconductor memory device according to the disclosed embodiments. Therefore, the memory devices 555_1 to 555_n and 565_1 to 565_n may correct errors of data stored in a non-volatile memory cell array using the error correction circuit according to the disclosed embodiments. The memory devices 555_1 to 555_n and 565_1 to 565_n may be a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 9:
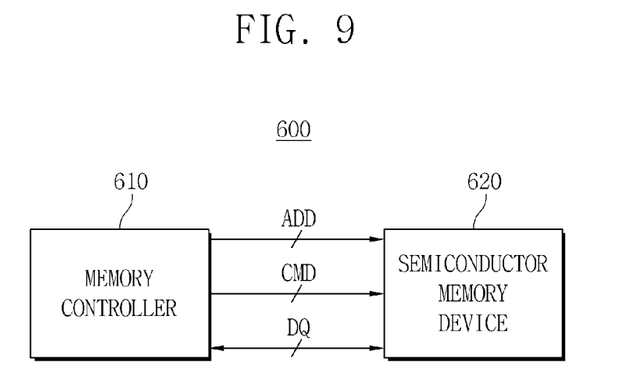
FIG. 9 is a block diagram of another example of a memory system including a semiconductor memory device in accordance with certain embodiments.

FIG. 9 is a block diagram of another example of a memory system 600 including a semiconductor memory device in accordance with certain embodiments.

Referring to FIG. 9, the memory system 600 may include a memory controller 610 and a semiconductor memory device 620.

The memory controller 610 may generate address signals ADD and command signals CMD, and provide the address signals ADD and the command signals CMD to the semiconductor memory device 620 through buses. Data DQ may be transmitted from the memory controller 610 to the semiconductor memory device 620 through the buses, or transmitted from the semiconductor memory device 620 to the memory controller 610 through the buses.

The semiconductor memory device 620 may correct error of data stored in a non-volatile memory cell array using the error correction circuit according to the disclosed embodiments.

Figure 10:
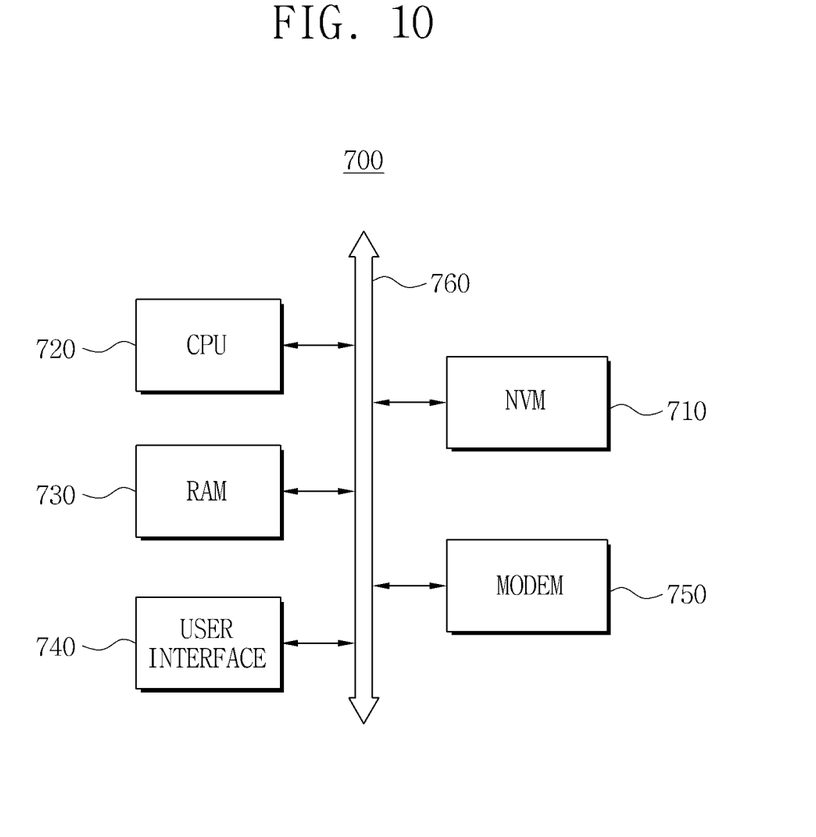
FIG. 10 is a block diagram of an example of an electronic system including a semiconductor memory device in accordance with certain embodiments.

FIG. 10 is a block diagram of an example of an electronic system 700 including a semiconductor memory device in accordance with certain embodiments.

Referring to FIG. 10, the electronic system 700 in accordance with certain embodiments may include a central processing unit (CPU) 720 electrically connected to a system bus 760, a random access memory (RAM) 730, a user interface 740, a MODEM 750 such as a baseband chipset, and a non-volatile memory device (NVM) 710.

The NVM 710 and the RAM 730 may store or output data, and include various logic circuits therein. When the electronic system 700 according to example embodiments is a mobile device, a battery (not shown) that supplies operating voltage to the electronic system 700 may be additionally provided. Although not shown in FIG. 10, the electronic system 700 may be further provided with an application chipset, a camera image processor, and a mobile DRAM, that is obvious to an ordinary skill in the art. For example, the NVM 710, may be included in a solid state drive/disk (SSD) using non-volatile memory devices for storing data. Further, the NVM 710 may be provided as a fusion flash memory in which a static random access memory (SRAM), a NAND flash memory and a NOR interface logic are combined.

A semiconductor device according to example embodiments may be applied to a part of the electronic system 700. For example, when the electronic system 700 is booting, the example embodiments may be applied in setting operation environments of the NVM 710 or the RAM 730. Each of the NVM 710 and the RAM 730 may include a non-volatile memory cell array according to the above disclosed embodiments, read information stored in the non-volatile memory cell array during an initial boosting of the NVM 710 or the RAM 730, and use fuse data read from the non-volatile memory cell array as information for setting the operation conditions.

The semiconductor device and/or the system according to example embodiments of the inventive concepts may be mounted using various types of packages. For example, the semiconductor device and/or the system may be mounted using packages such as a Package on Package (POP), a Ball grid arrays (BGAs), a Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a Thin Quad Flatpack (TQFP), a System In Package (SIP), a Multi Chip Package (MCP), a Wafer-level Fabricated Package (WFP), and a Wafer-Level Processed Stack Package (WSP).

The disclosed embodiments may be applied to devices such as a semiconductor device, and particularly, to a semiconductor memory device and a memory system including the semiconductor memory device.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of the present disclosure as defined in the claims. In the claims, means-plus-function clauses are intended to cover the structures described herein as performing the recited function, and not only structural equivalents but also equivalent structures.

What is claimed is:

1. A semiconductor memory device, comprising:
a dynamic random access memory (DRAM) cell array;
a parity bit generator configured to generate a first set of parity bits having at least one bit based on input data received from outside the semiconductor memory device;
a nonvolatile memory cell array configured to store the input data and the first set of parity bits corresponding to the input data, and to output first data corresponding to the input data and a second set of parity bits corresponding to the first set of parity bits; and
an error correction circuit configured to generate second data as corrected data based on the first data and the second set of parity bits,
wherein the semiconductor memory device is configured to use the second data to select a spare cell included in the DRAM cell array.

2. The device according to claim 1, wherein the semiconductor memory device is configured to use the second data as corrected data if the first data is different from the input data.

3. The device according to claim 1, wherein the semiconductor memory device is configured to use the second data to replace a defective word line of the DRAM cell array with a spare word line.

4. The device according to claim 1, wherein the semiconductor memory device is configured to use the second data to replace a defective column selecting line of the DRAM cell array with a spare column selecting line.

5. The device according to claim 1, wherein the DRAM cell array includes a normal memory cell array connected to word lines and column selecting lines, and a spare memory cell array connected to spare word lines and spare column selecting lines.

6. The device according to claim 5, further comprising:
a column decoder configured to generate column selection signals, and to provide the column selection signals to the column selecting lines; and
a spare column decoder configured to generate spare column selection signals based on the second data, and to provide the spare column selection signals to the spare column selecting lines when a defective cell is included in the normal memory cell array.

7. The device according to claim 1, wherein the second data is anti-fuse program data.

8. The device according to claim 1, wherein the semiconductor memory device is a stacked memory device in which a plurality of chips communicating data and control signals through a through-silicon-via (TSV) are stacked.

9. The device according to claim 1, wherein the nonvolatile memory cell array includes an anti-fuse cell array having a plurality of anti-fuse cells.

10. The device according to claim 1, wherein a number of bits of the first set of parity bits is smaller than a number of bits of the input data.

11. A semiconductor memory device, comprising:
a dynamic random access memory (DRAM) cell array;
a nonvolatile memory cell array configured to store input data and a first set of parity bits having at least one bit, the input data and the first set of parity bits received from outside the semiconductor memory device; and
an error correction circuit configured to generate second data as corrected data based on first data corresponding to the input data, the first data being received from the nonvolatile memory cell array, and a second set of parity bits corresponding to the first set of parity bits, the second set of parity bits being received from the nonvolatile memory cell array,
wherein the semiconductor memory device is configured to use the second data to repair a defective cell included in the DRAM cell array.

12. The device according to claim 11, wherein the semiconductor memory device is configured to use the second data as corrected data if the first data is different from the input data.

13. The device according to claim 11, wherein the semiconductor memory device is configured to use the second data to replace a defective word line of the DRAM cell array with a spare word line.

14. The device according to claim 11, wherein the semiconductor memory device is configured to use the second data to replace a defective column selecting line of the DRAM cell array with a spare column selecting line.

15. The device according to claim 11, wherein the nonvolatile memory cell array includes an anti-fuse cell array having a plurality of anti-fuse cells.

16. A semiconductor memory device comprising:
a memory cell array;
a parity bit generator configured to generate a first set of parity bits having at least one bit based on first data received from outside the semiconductor memory device;
an anti-fuse cell array including a plurality of anti-fuse cells configured to store the first data and the first set of parity bits, and to transfer second data corresponding to the first data, and a second set of parity bits corresponding to the first set of parity bits; and
an error correction circuit configured to generate third data as corrected data based on the second data and the second set of parity bits,
wherein the semiconductor memory device is configured to use the third data to select a spare cell of the memory cell array.

17. The semiconductor memory device of claim 16, wherein the memory cell array includes a plurality of dynamic random memory (DRAM) cells.

18. The semiconductor memory device of claim 16, wherein a number of bits of the first set of parity bits is smaller than a number of bits of the first data.

19. The semiconductor memory device of claim 16, wherein the memory cell array includes a normal memory cell array connected to word lines and column selecting lines, and a spare memory cell array connected to one or more spare word lines and one or more spare column selecting lines, and
wherein the third data is address information used to select at least one of the spare word lines and the spare column selecting lines.

20. The semiconductor memory device of claim 19, further comprising a row comparator circuit configured to compare an input address to the third data, and a column comparator circuit configured to compare an input address to the third data.

* * * * *